(12) United States Patent
Park et al.

(10) Patent No.: US 7,087,462 B1
(45) Date of Patent: Aug. 8, 2006

(54) METHOD FOR FORMING LEADLESS SEMICONDUCTOR PACKAGES

(75) Inventors: Sang-Bae Park, Kao-Hsiung (TW); Yong-Gill Lee, Kao-Hsiung (TW); Hyung-Jun Park, Kao-Hsiung (TW); Chang-Young Sohn, Kao-Hsiung (TW)

(73) Assignee: Advanced Semiconductor Engineering, Inc., Kao-Hsiung (TW)

( * ) Notice: Subject to any disclaimer, the term of this patent is extended or adjusted under 35 U.S.C. 154(b) by 0 days.

(21) Appl. No.: 11/160,070

(22) Filed: Jun. 7, 2005

(51) Int. Cl.
*H01L 21/44* (2006.01)
(52) U.S. Cl. ............... 438/112; 438/461; 438/E23.054; 257/666
(58) Field of Classification Search ........ 438/111–113, 438/124, 460–462, 689; 257/666, 667, 676, 257/784, 787
See application file for complete search history.

(56) References Cited

U.S. PATENT DOCUMENTS 6,933,594 B1 * 8/2005 McLellan et al. ........... 257/676

\* cited by examiner

*Primary Examiner*—Quoc Hoang
(74) *Attorney, Agent, or Firm*—Winston Hsu

(57) ABSTRACT

The present invention includes providing a leadframe including a metal layer formed on an upper surface of the leadframe and a plurality of units in an array arrangement, in which each unit includes a die pad, a plurality of leads, and a plurality of outer dambars, adhering a die to the die pad, forming a plurality of conductive wires to electrically connect bond pads of the die with bond regions of the leads, forming an encapsulation covering the leadframe, forming a patterned photoresist layer on a lower surface of the leadframe to expose a plurality of interval regions and the outer dambars, performing an etching process to expose the metal layer located in the interval regions and the outer dambars, cutting off the metal layer located in the interval regions by a half cutting process, and performing a singulation process to singulate the units.

17 Claims, 16 Drawing Sheets

METHOD FOR FORMING LEADLESS SEMICONDUCTOR PACKAGES

BACKGROUND OF THE INVENTION

1. Field of the Invention

The present invention relates to a method for forming leadless semiconductor packages, and more particular, to a method for forming leadless semiconductor packages which is capable of reducing the number of saw blades used.

2. Description of the Prior Art

The conventional leadframe package has been applied widely for a long time in the integrated circuit package field. It has advantages such as low manufacturing cost, high reliability, and so forth. However, the conventional leadframe package possesses rather long outer leads and inner leads, and it is gradually unable to satisfy the development of the integrated circuits, which have high numbers of input/output (I/O) connections and tiny sizes. For this reason, a leadless semiconductor package is developed and applied gradually. Since it is leadless, it is capable of reducing the footprint and the package size. Moreover, since the length of the lead is shortened, the leadless semiconductor package has advantages of low electric resistance, inductance, and electric capacity, and it is very suitable for cell phones, personal digital assistants (PDAs), digital cameras, and so forth.

Please refer to FIG. 1 to FIG. 3. FIG. 1 to FIG. 3 are schematic diagrams of a method for forming a leadless semiconductor package 10 according to the prior art. As shown in FIG. 1, a unit 12 of a leadframe is provided at first. The unit 12 includes a die pad 14 and a plurality of leads 16. Therein, the unit 12 is composed of copper, iron, or an alloy of copper and iron, and a metal layer 18, which is composed of silver, is formed on an upper surface of the unit 12. A die 20 is adhered to the metal layer 18 of the die pad 14, and a plurality of conductive wires 21 are formed by wire bonding to electrically connect a plurality of bond pads (not shown in FIG. 1) on the die 20 with a plurality of bond regions 22, 24, 26, and 28 of the corresponding leads 16. Furthermore, an encapsulation 30 covers the unit 12 and exposes lower surfaces of the die pad 14 and the leads 16.

As shown in FIG. 2, a photoresist layer (not shown in FIG. 2) is formed on a lower surface of unit 12, and a photolithographic process is performed to form a patterned photoresist layer 32. Therein, the patterned photoresist layer 32 exposes the die pad 14 and the bond regions 22, 24, 26, and 28. Then, a metal layer 34, which is composed of tin or lead, is formed on the lower surfaces of the die pad 14 and the bond regions 22, 24, 26, and 28.

As shown in FIG. 3, the patterned photoresist layer 32 is removed. A cutting process is performed by utilizing a saw blade (not shown in FIG. 3) to remove a plurality of interval regions 36 of the leads 16 and cut off the metal layer 18 in the interval regions 36 to electrically isolate the bond regions 22, 24, 26, and 28. Finally, a leadless semiconductor package 10 is formed.

The method for forming the leadless semiconductor package 10 according to the prior art utilizes the saw blade to cut off the leads 16 and the metal layer 18 on the leads 16 directly. Since the material of the leads 16 is different from the material of the metal layer 18, it requires the expenditure of many saw blades and increases a lot of the manufacturing cost. For this reason, how to reduce the expenditure of saw blades is very important.

SUMMARY OF THE INVENTION

It is therefore an object of the present invention to provide a method for forming leadless semiconductor packages to resolve the above problems.

The present invention discloses a method for forming leadless semiconductor packages as follows. A leadframe is provided, and the leadframe includes a plurality of units in an array arrangement, in which each of the units includes a die pad, a plurality of leads, and a plurality of outer dambars disposed in a periphery of each of the units. Therein, a metal layer is formed on an upper surface of the leadframe, and the leads include a plurality of bond regions. A lower surface of a die is adhered to the metal layer of the die pad, in which a plurality of bond pads are disposed on an upper surface of the die. Then, a plurality of conductive wires is formed to electrically connect the bond pads with the corresponding bond regions of the leads. An encapsulation is formed to cover the die, the leads, and the leadframe, in which the encapsulation exposes lower surfaces of the die pad, the leads, and the outer dambars. A patterned photoresist layer is formed on a lower surface of the leadframe, in which the patterned photoresist layer exposes a plurality of interval regions of the leads and the outer dambars, in which the interval regions are located between the adjacent bond regions and the adjacent bond regions and the die pad. Utilizing the patterned photoresist layer as a mask, an etching process is performed to expose the metal layer located in the interval regions and the outer dambars, and then the patterned photoresist layer is removed. A half cutting process is utilized to cut off the metal layer located in the interval regions to electrically isolate the bond regions. Finally, a singulation process is performed to singulate the units by cutting off the metal layer and the encapsulation located in the outer dambars.

The present invention utilizes an etching process to remove interval regions and outer dambars of a leadframe to expose a metal layer, and then utilizes a half cutting process to cut off the metal layer located in the interval regions and a singulation process to singulate units of the leadframe by cutting off the metal layer and the encapsulation located in the outer dambars. Therefore, the present invention is capable of reducing the expenditure of saw blades required by the prior art, in which the saw blades directly cut off the leadframe and the metal layer located in the interval regions and the outer dambars.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
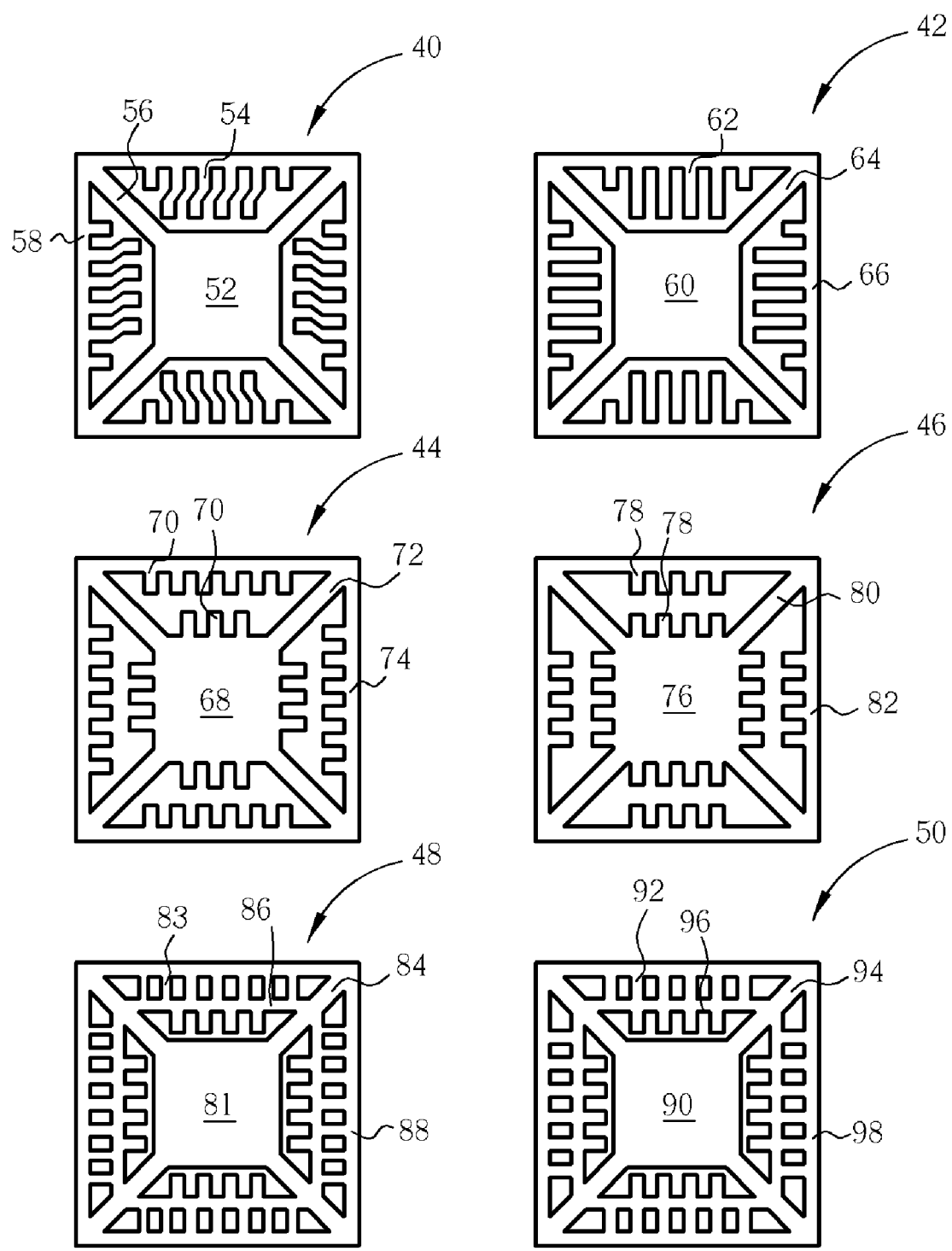
FIG. 4 is a schematic diagram showing a plurality of leadframes.

The present invention provides a method for forming leadless semiconductor packages, and it applies to each kind of leadframes such as in-line lead leadframes and staggered lead leadframes shown in FIG. 4. FIG. 4 is a schematic diagram showing a plurality of leadframes 40, 42, 44, 46, 48, and 50. In general, a leadframe usually includes a plurality of units in an array arrangement. However, the leadframes shown in FIG. 4 are merely exemplary embodiments, and a unit is represented by each of the leadframes. As shown in FIG. 4, a leadframe 40 includes a die pad 52, a plurality of staggered leads 54, a plurality of tie bars 56, and a plurality of outer dambars 58. The tie bars 56 connect the die pad 52 and the outer dambars 58, and the leads 54 connect to the outer dambars 58. A leadframe 42 includes a die pad 60, a plurality of in-line leads 62, a plurality of tie bars 64, and a plurality of outer dambars 66. The tie bars 64 connect the die pad 60 and the outer dambars 66, and the leads 62 connect to the outer dambars 66. A leadframe 44 includes a die pad 68, a plurality of staggered leads 70, a plurality of tie bars 72, and a plurality of outer dambars 74. The tie bars 72 connect the die pad 68 and the outer dambars 74, and a portion of the leads 70 connect to the outer dambars 74 and a portion of the leads 70 connect to the die pad 68. A leadframe 46 includes a die pad 76, a plurality of in-line leads 78, a plurality of tie bars 80, and a plurality of outer dambars 82. The tie bars 80 connect the die pad 76 and the outer dambars 82, and a portion of the leads 78 connect to the outer dambars 82 and a portion of the leads 78 connect to the die pad 76. A leadframe 48 includes a die pad 81, a plurality of staggered leads 83, a plurality of tie bars 84, a plurality of inner dambars 86, and a plurality of outer dambars 88. The tie bars 84 connect the die pad 81 and the outer dambars 88, and the inner dambars 86 connect the leads 83 serially and the tie bars 84. A leadframe 50 includes a die pad 90, a plurality of in-line leads 92, a plurality of tie bars 94, a plurality of inner dambars 96, and a plurality of outer dambars 98. The tie bars 94 connect the die pad 90 and the outer dambars 98, and the inner dambars 96 connect the leads 92 serially and the tie bars 94. It is to be noted that the present invention is not restricted to being applied only to the leadframes mentioned above. The present invention also can be applied to other kinds of leadframes or to leadframes which have more than three row leads.

Figure 5:
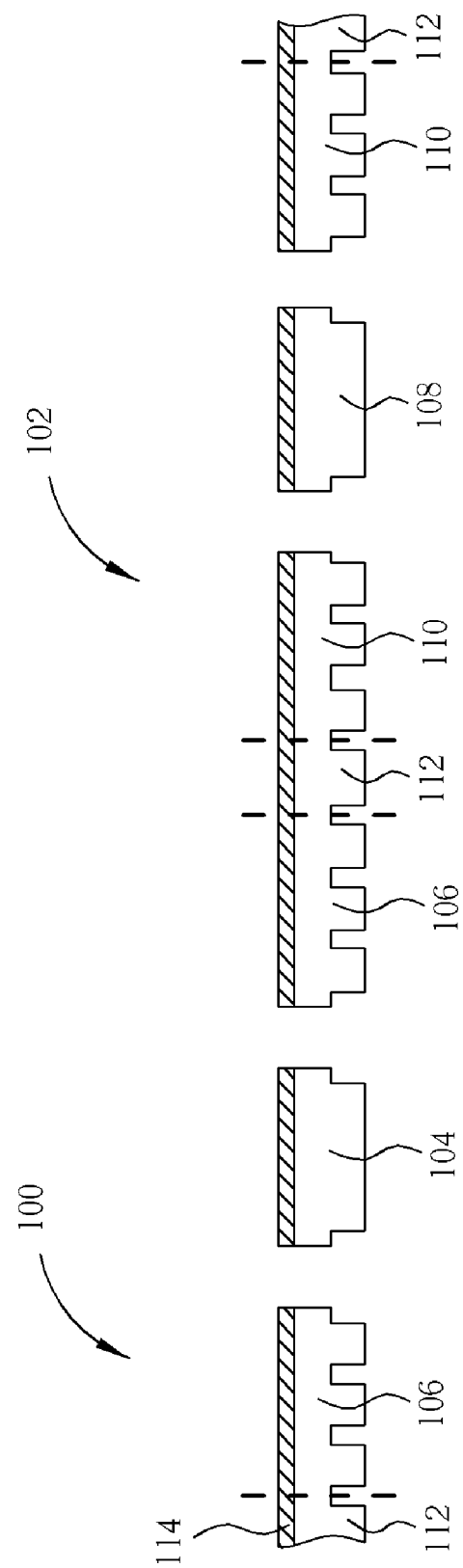
FIG. 5 to FIG. 10 are schematic diagrams of a method for forming leadless semiconductor packages according to a first preferred embodiment of the present invention.

Please refer to FIG. 5 to FIG. 10. FIG. 5 to FIG. 10 are schematic diagrams of a method for forming leadless semiconductor packages 154 and 156 according to a first preferred embodiment of the present invention. The first preferred embodiment of the present invention can be applied to the leadframes 40, 42, 48, and 50 mentioned above. As shown in FIG. 5, a leadframe including a plurality of units 100 and 102 in an array arrangement is provided. The units 100 and 102 can be composed of copper, iron, an alloy of copper and iron, and so forth. Therein, the unit 100 includes a die pad 104 and a plurality of leads 106, and the unit 102 includes a die pad 108 and a plurality of leads 110. The units 100 and 102 connect together with an outer dambar 112 disposed in peripheries of the units 100 and 102, and the leads 106 and 110 connect to the outer dambar 112 respectively. Moreover, a metal layer 114 is formed on upper surfaces of the units 100 and 102 of the leadframe by a plating process. Therein, the metal layer 114 is composed of silver and so forth, and it is favorable for a wire bonding process afterward.

Figure 6:
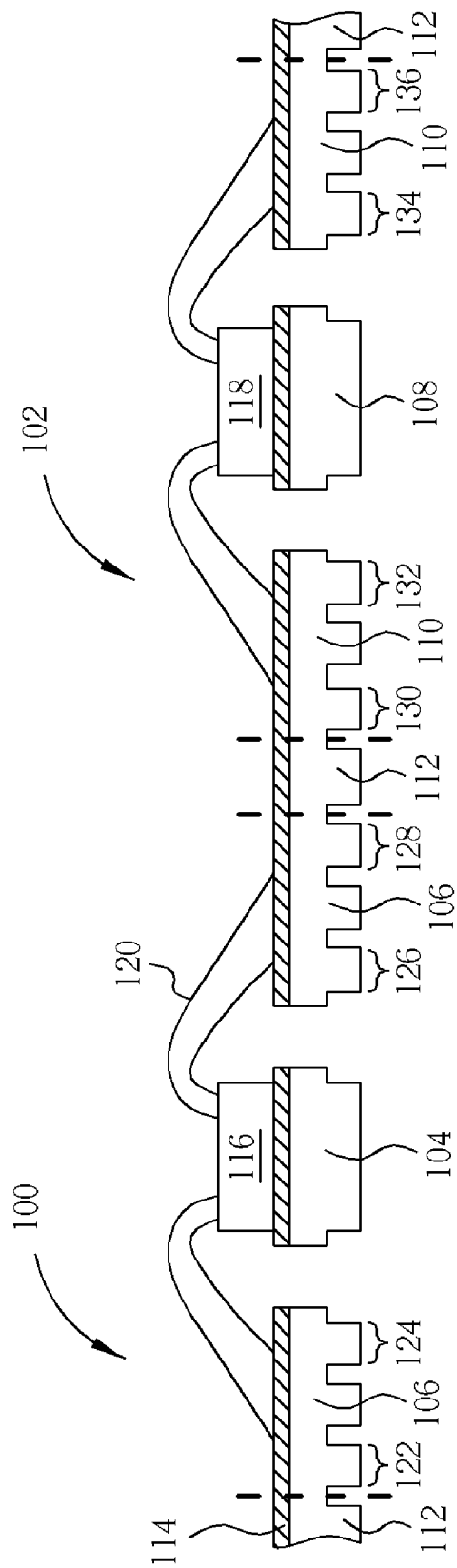

As shown in FIG. 6, lower surfaces of a plurality of dice 116 and 118 are adhered to the metal layer 114 of die pads 104 and 108 by utilizing adhesion glue (not shown in FIG. 6) such as silver glue. Therein, a plurality of bond pads (not shown in FIG. 6) are disposed on upper surfaces of the dice 116 and 118. Then, a plurality of conductive wires 120 are formed by a wire bonding process to electrically connect the bond pads with a plurality of bond regions 122, 124, 126, 128, 130, 132, 134, and 136 of the corresponding leads 106 and 110.

Figure 7:
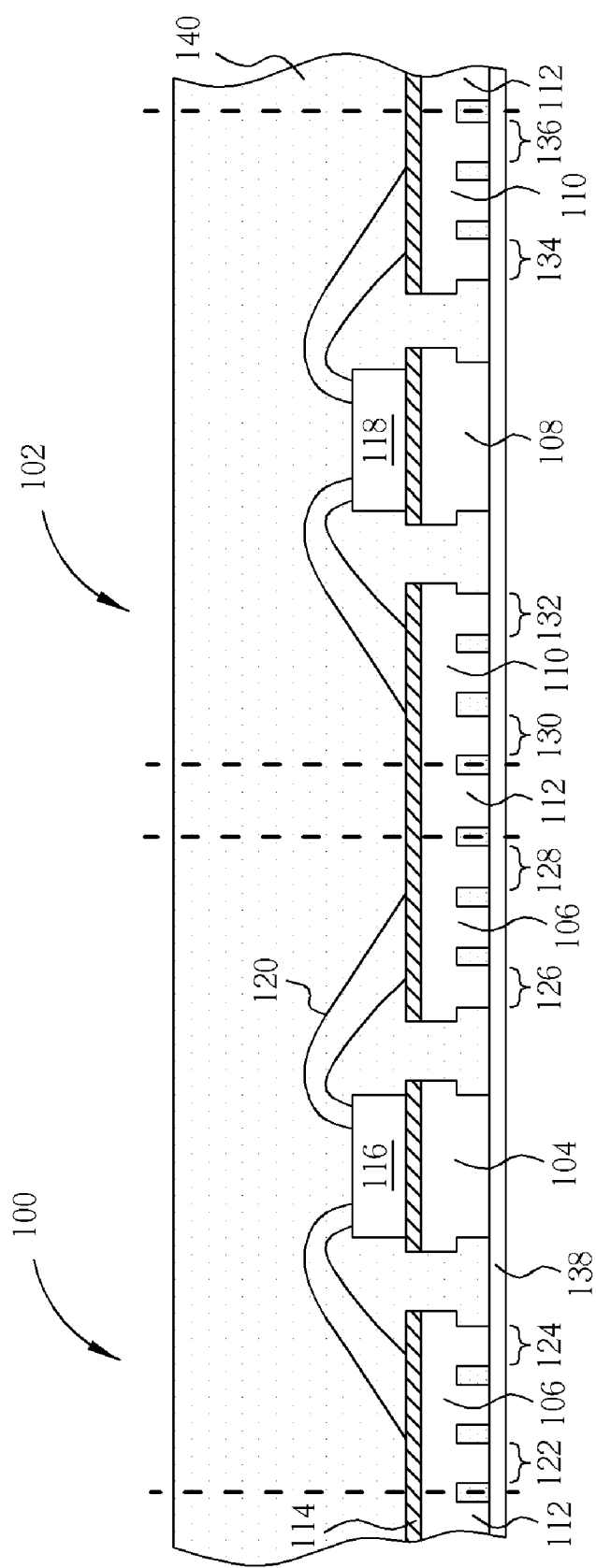

As shown in FIG. 7, a tape 138 is adhered to lower surfaces of the units 100 and 102 of the leadframe. The tape 138 is capable of preventing encapsulation overflow afterward. Then, an encapsulation 140 is formed by a molding or printing process to cover the units 100 and 102 of the leadframe to form a mold part. Because the tape 138 is adhered to the lower surfaces of the units 100 and 102, the encapsulation 140 of the mold part exposes lower surfaces of the die pads 104 and 108, the leads 106 and 110, and the outer dambar 112.

Figure 8:
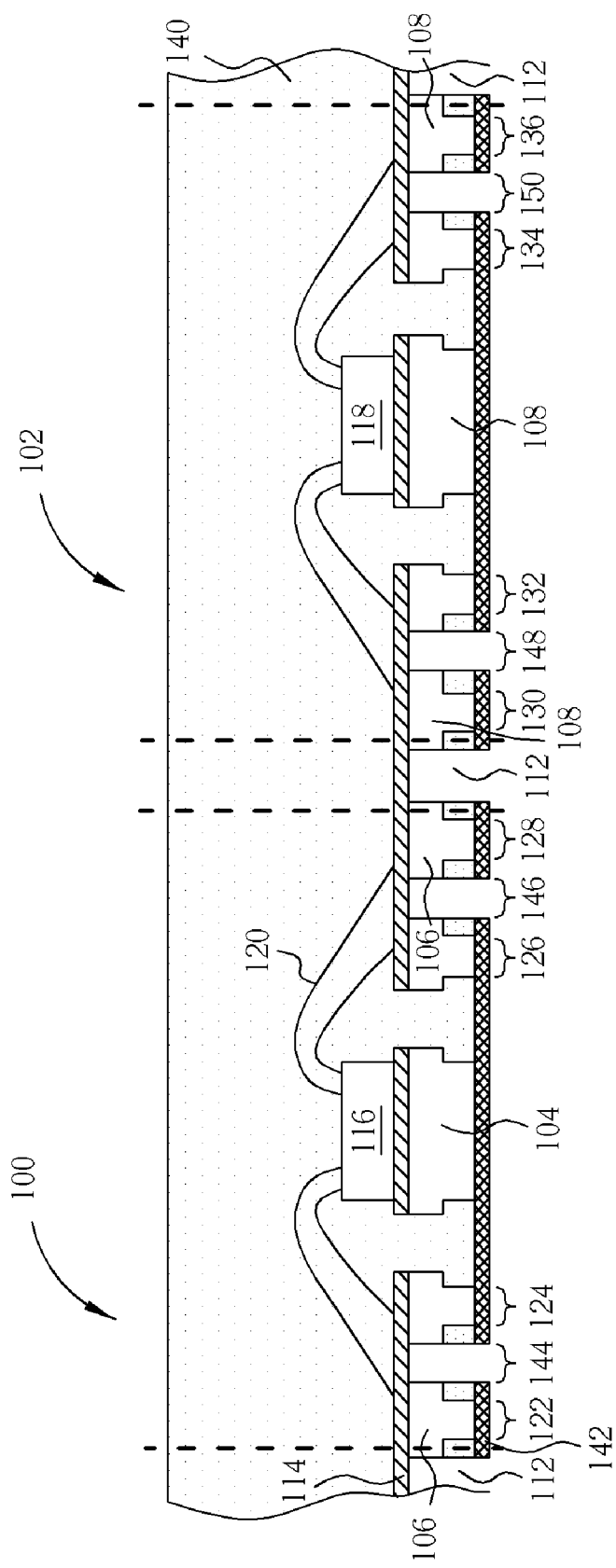

As shown in FIG. 8, the tape 138 is removed. A photoresist layer (not shown in FIG. 8) is formed on the lower surfaces of the units 100 and 102 of the leadframe, and a photolithographic process is performed to form a patterned photoresist layer 142. Therein, the patterned photoresist layer 142 exposes a plurality of interval regions 144, 146, 148, and 150 of the leads 106 and 110, and the outer dambar 112, in which the interval regions 144, 146, 148, and 150 are located between the adjacent bond regions 122, 124, 126, 128, 130, 132, 134, and 136. Then, an etching process is performed by utilizing the patterned photoresist layer 142 as a mask to expose the metal layer 114 located in the interval regions 144, 146, 148, and 150, and the outer dambar 112. It is to be noted that the interval regions 144, 146, 148, and 150 can be located in the inner dambars 86 and 96 of the leadframes 48 and 50 shown in FIG. 4, the patterned photoresist layer 142 also exposes the inner dambars 86 and 96, and the metal layer 114 located in the inner dambars 86 and 96 is exposed after the etching process.

Figure 9:
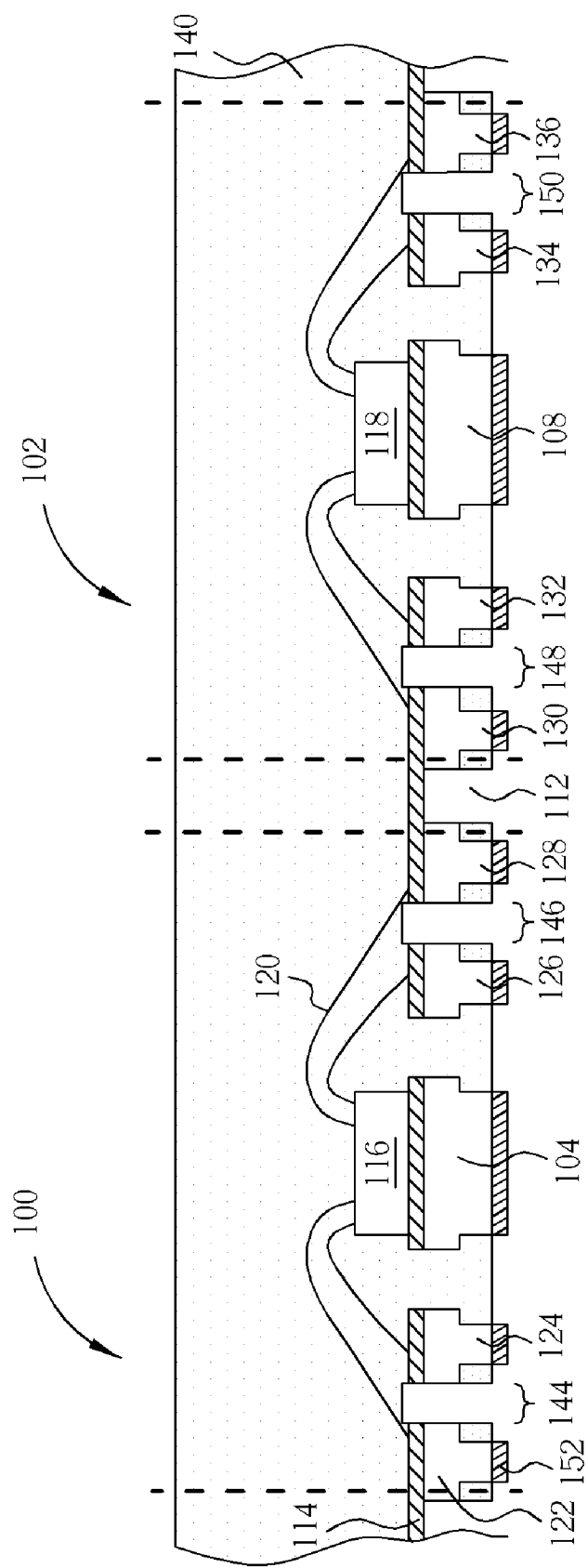

As shown in FIG. 9, the patterned photoresist layer 142 is removed. A metal layer 152, which is composed of tin or lead, is formed on the lower surfaces of the die pads 104 and 108, and the bond regions 122, 124, 126, 128, 130, 132, 134, and 136 by a plating process. Then, a half cutting process is performed by utilizing a saw blade, for example, to cut off the metal layer 114 located in the interval regions 144, 146, 148, and 150 to electrically isolate the bond regions 122, 124, 126, 128, 130, 132, 134, and 136. Therein, the half cutting process does not cut the conductive wires 120. It is to be noted that the half cutting process also cuts off the metal layer 114 of the inner dambars 86 and 96 of the leadframes 48 and 50 shown in FIG. 4.

Figure 10:
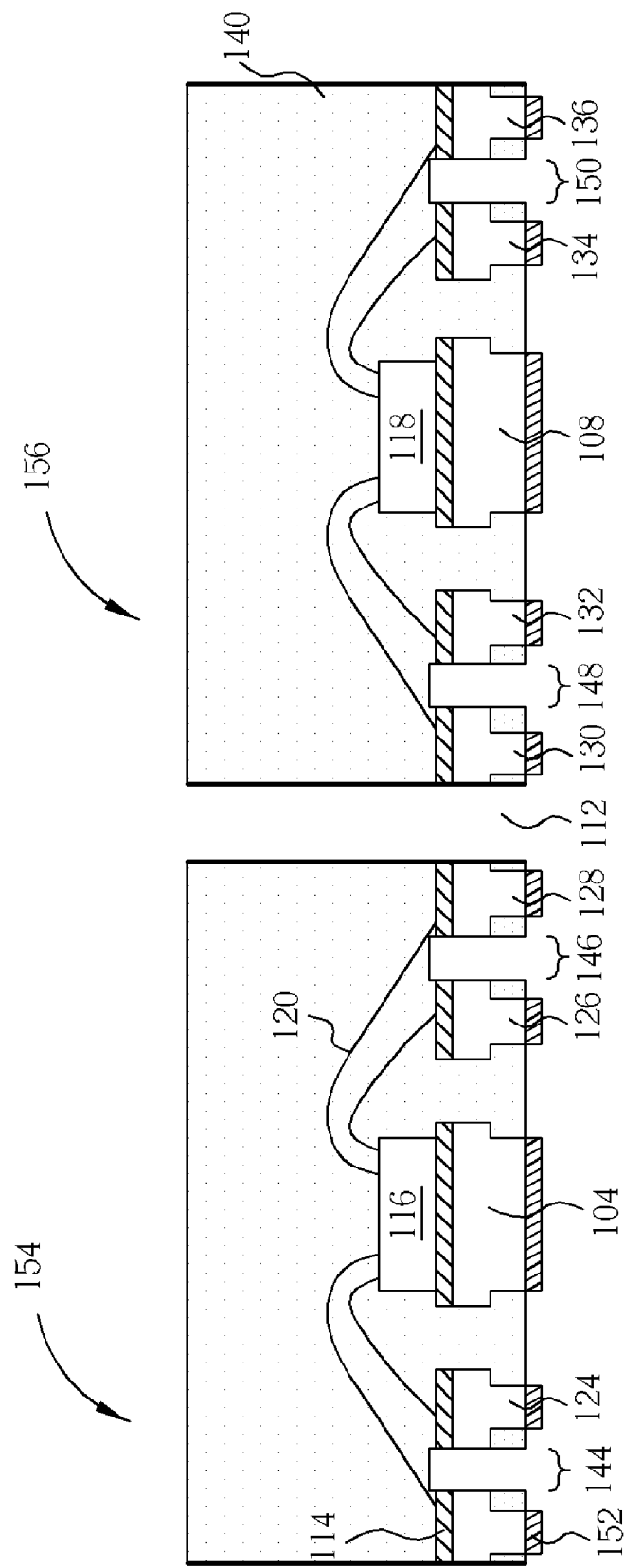
Figure 11:
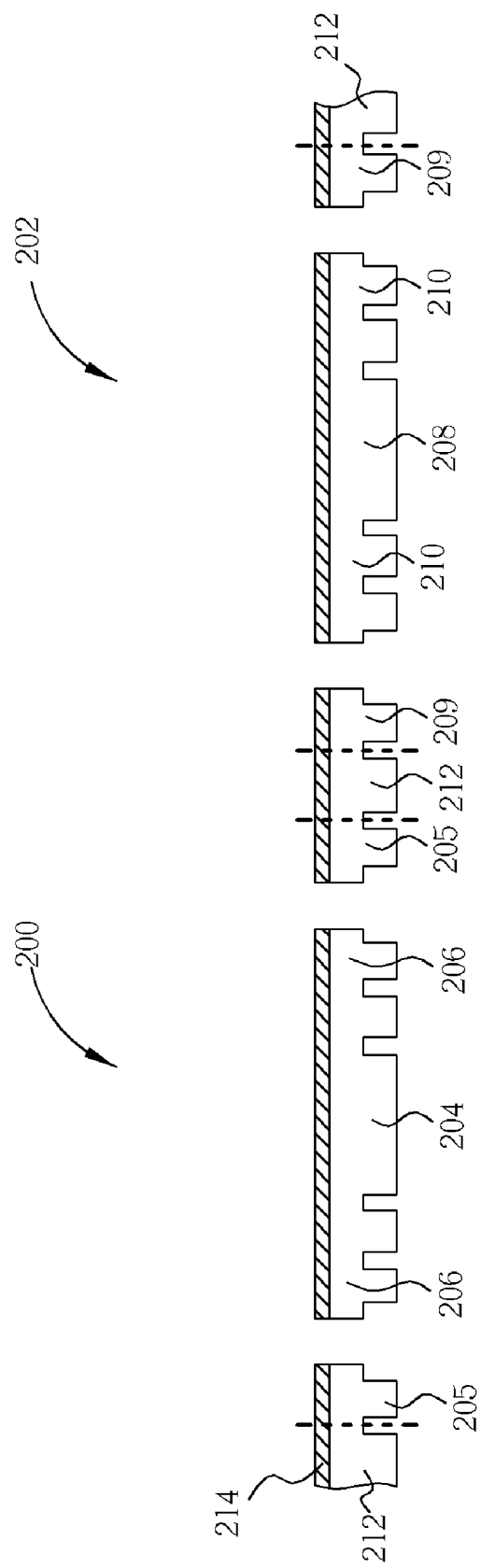
FIG. 11 to FIG. 16 are schematic diagrams of a method for forming leadless semiconductor packages according to a second preferred embodiment of the present invention.

As shown in FIG. 10, a singulation process is performed to singulate the units 100 and 102 by utilizing a saw blade, for example, to cut off the metal layer 114 and the encapsulation 140 located in the outer dambar 112 to form a plurality of leadless semiconductor packages 154 and 156.

The present invention utilizes an etching process to remove interval regions and outer dambars of a leadframe to expose a metal layer, and then utilizes a half cutting process to cut off the metal layer located in the interval regions and a singulation process to singulate units of the leadframe by cutting off the metal layer and the encapsulation located in the outer dambars. Therefore, the saw blade just needs to cut off the thin film metal layer and the encapsulation. The present invention is capable of reducing the expenditure of saw blades.

Figure 1:
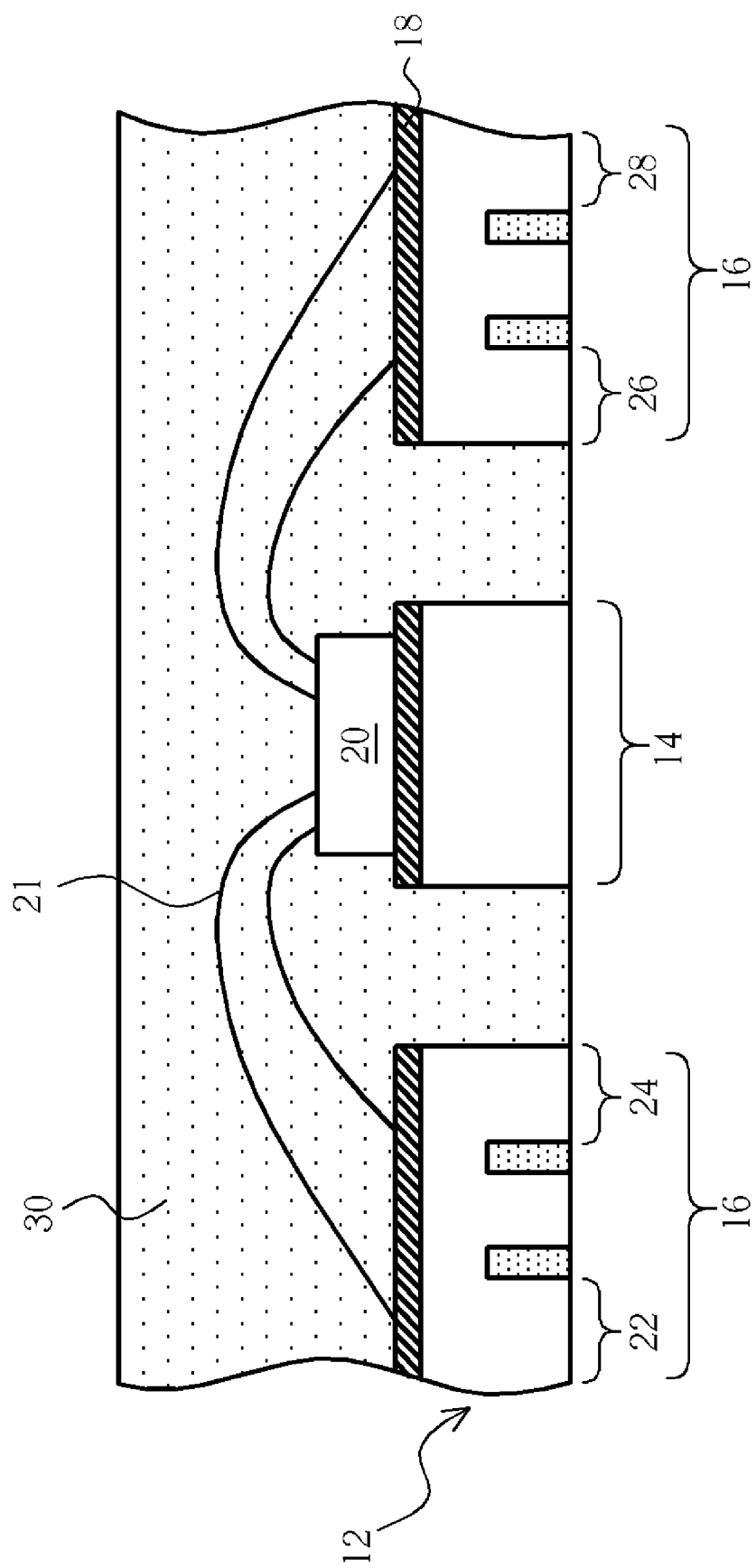
FIG. 1 to FIG. 3 are schematic diagrams of a method for forming a leadless semiconductor package according to the prior art.
Figure 2:
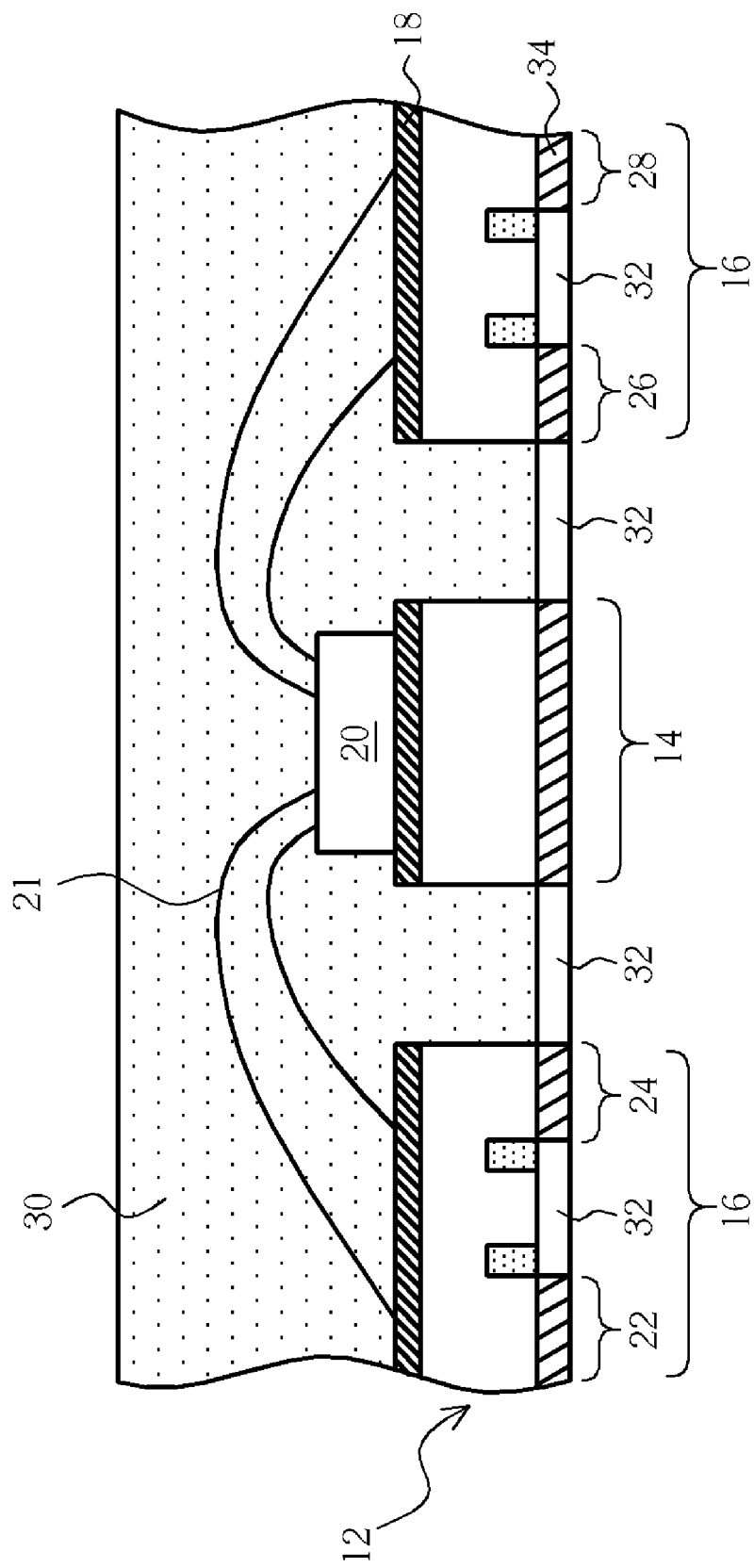
Figure 3:
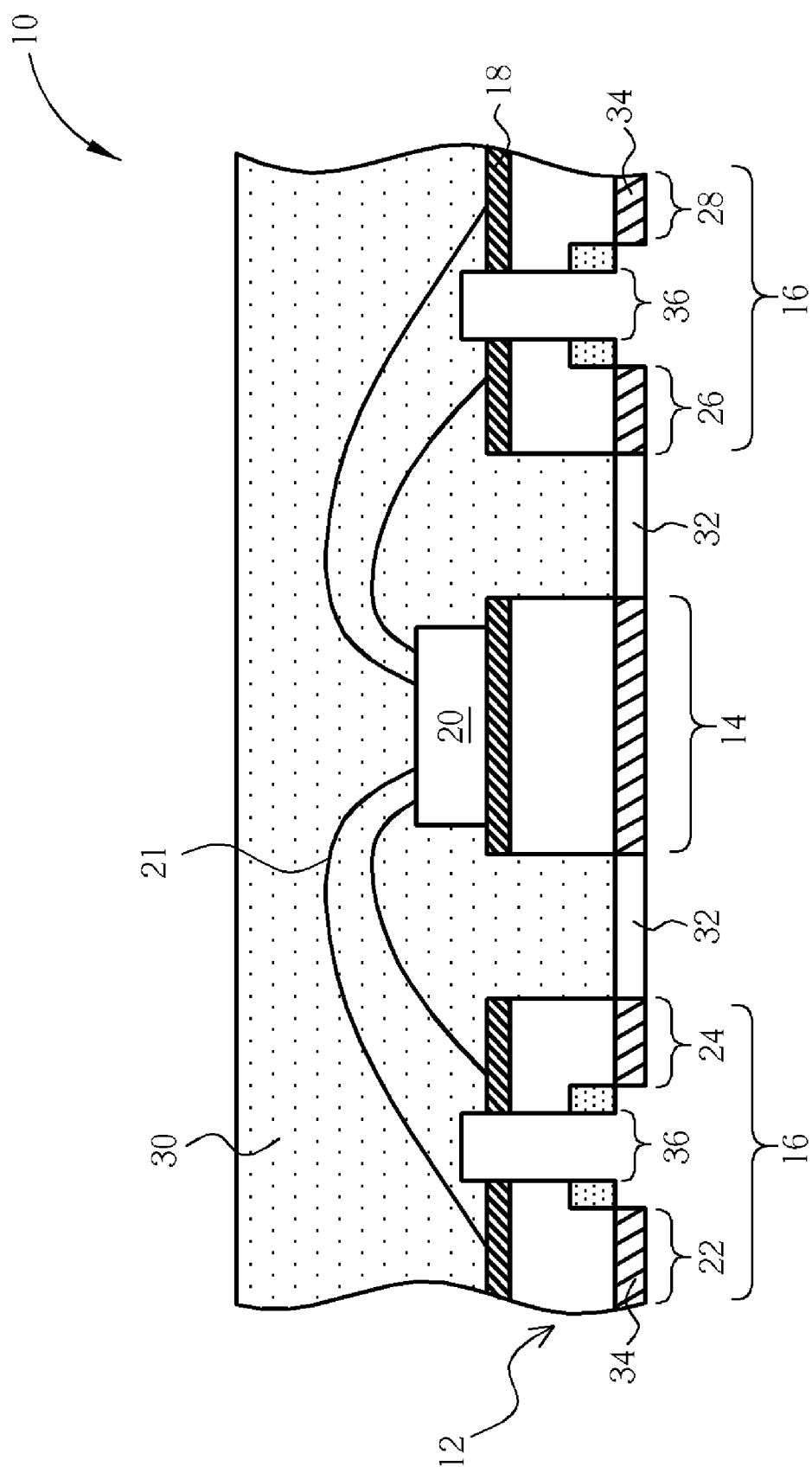

Please refer to FIG. 11 to FIG. 16. FIG. 11 to FIG. 16 are schematic diagrams of a method for forming leadless semiconductor packages 254 and 256 according to a second preferred embodiment of the present invention. The second preferred embodiment of the present invention can be applied to the leadframes 44 and 46 mentioned above. As shown in FIG. 1, a leadframe including plurality of units 200 and 202 in an array arrangement is provided. The units 200 and 202 can be composed of copper, iron, an alloy of copper and iron, and so forth. Therein, the unit 200 includes a die pad 204 and a plurality of leads 205 and 206, and the unit 202 includes a die pad 208 and a plurality of leads 209 and 210. The units 200 and 202 connect together with an outer dambar 212 disposed in peripheries of the units 200 and 202, the leads 205 and 209 connect to the outer dambar 212 respectively, and the leads 206 and 210 connect to the die pads 204 and 208 respectively. Moreover, a metal layer 214 is formed on upper surfaces of the units 200 and 202 of the leadframe by a plating process. Therein, the metal layer 214 is composed of silver and so forth, and it is favorable for a wire bonding process afterward.

Figure 12:
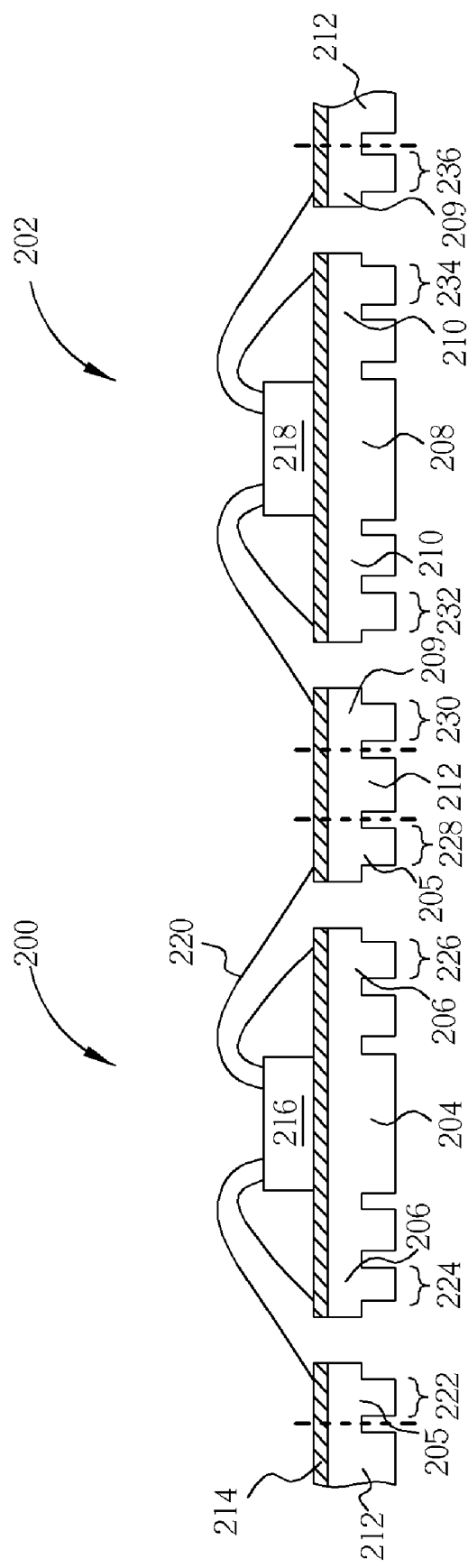

As shown in FIG. 12, lower surfaces of a plurality of dice 216 and 218 are adhered to the metal layer 214 of die pad 204 and 208 by utilizing adhesion glue (not shown in FIG. 12) such as silver glue. Therein, a plurality of bond pads (not shown in FIG. 12) are disposed on upper surfaces of the dice 216 and 218. Then, a plurality of conductive wires 220 are formed by a wire bonding process to electrically connect the bond pads with a plurality of bond regions 222, 224, 226, 228, 230, 232, 234, and 236 of the corresponding leads 205, 206, 209, and 210.

Figure 13:
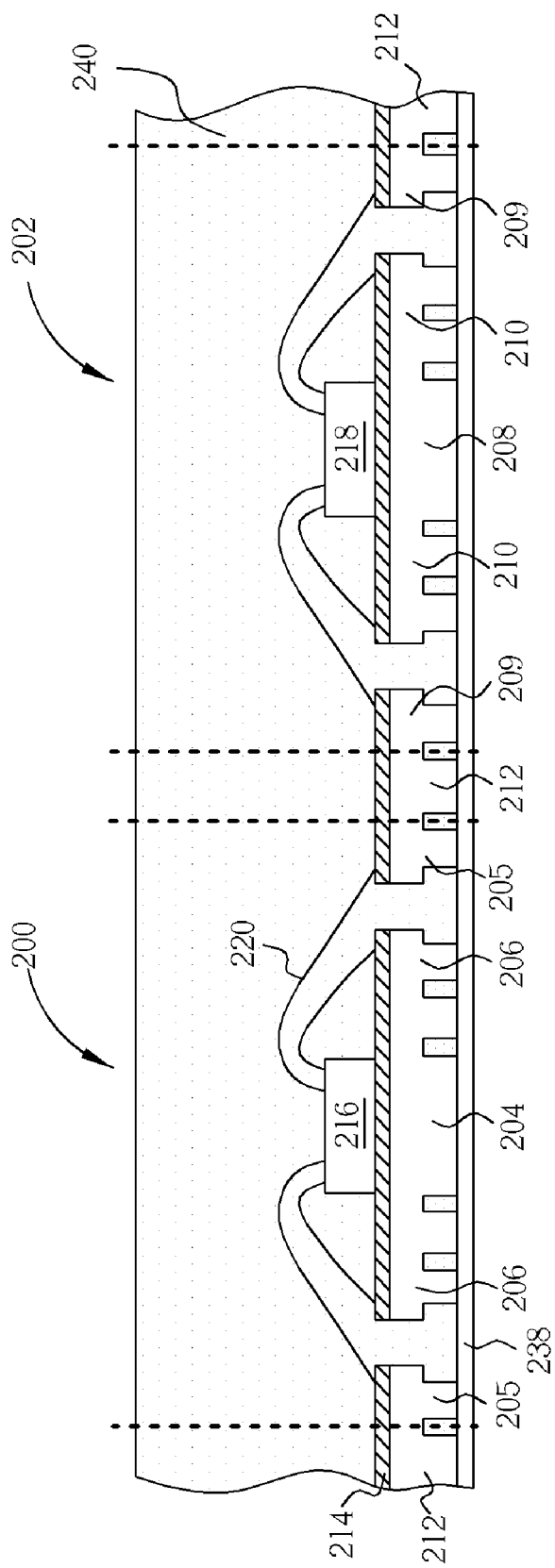

As shown in FIG. 13, a tape 238 is adhered to lower surfaces of the units 200 and 202 of the leadframe. The tape 238 is capable of preventing encapsulation overflow afterward. Then, an encapsulation 240 is formed by a molding or printing process to cover the units 200 and 202 of the leadframe to form a mold part. Because the tape 238 is adhered to the lower surfaces of the units 200 and 202, the encapsulation 240 of the mold part exposes lower surfaces of the die pads 204 and 208, the leads 205, 206, 209 and 210, and the outer dambar 212.

Figure 14:
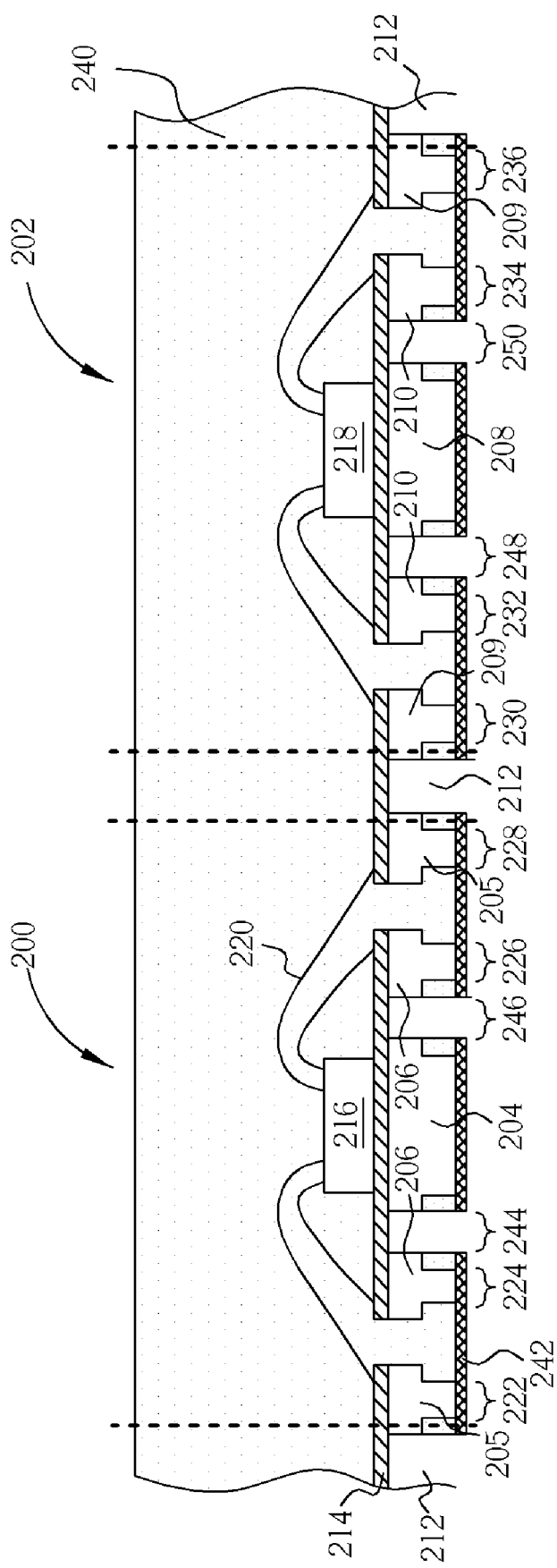

As shown in FIG. 14, the tape 238 is removed. A photoresist layer (not shown in FIG. 14) is formed on the lower surfaces of the units 200 and 202 of the leadframe, and a photolithographic process is performed to form a patterned photoresist layer 242. Therein, the patterned photoresist layer 242 exposes a plurality of interval regions 244, 246, 248, and 250 of the leads 205, 206, 209 and 210, and the outer dambar 212, in which the interval regions 244, 246, 248, and 250 are located between the bond regions 224, 226, and the adjacent die pad 204, and the bond regions 232, and 234, and the adjacent die pad 208. Then, an etching process is performed by utilizing the patterned photoresist layer 242 as a mask to expose the metal layer 214 located in the interval regions 244, 246, 248, and 250, and the outer dambar 212.

Figure 15:
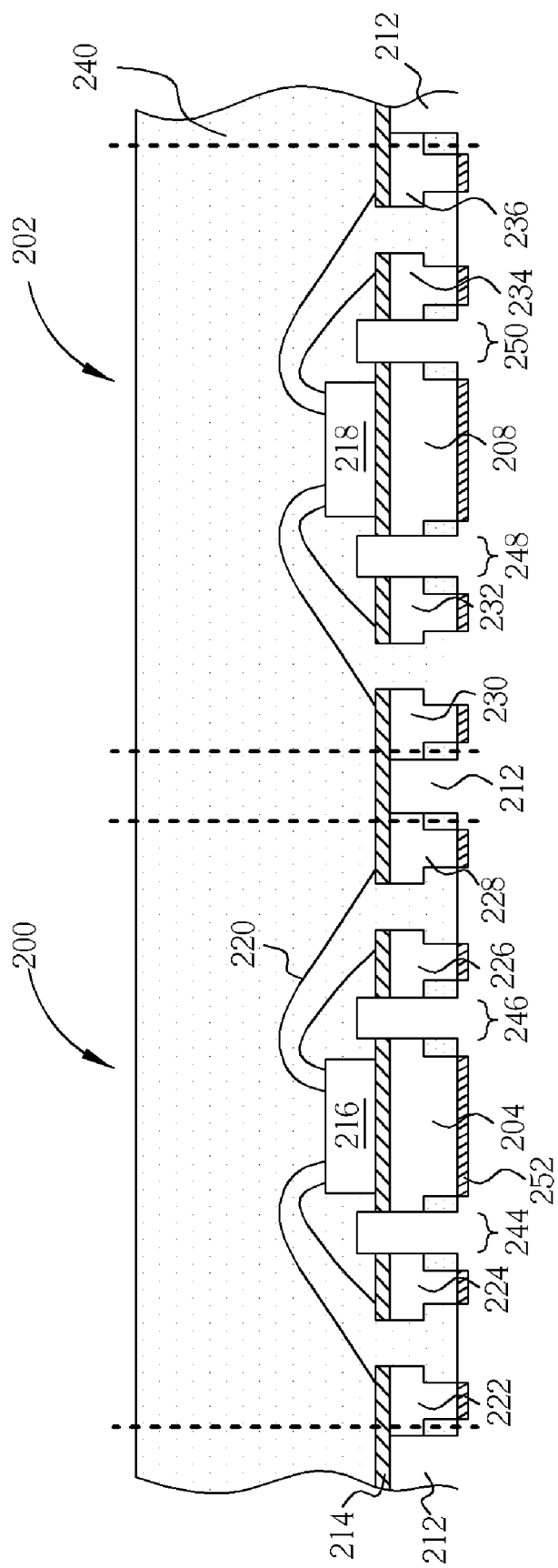

As shown in FIG. 15, the patterned photoresist layer 242 is removed. A metal layer 252, which is composed of tin or lead, is formed on the lower surfaces of the die pads 204 and 208, and the bond regions 222, 224, 226, 228, 230, 232, 234, and 236 by a plating process. Then, a half cutting process is performed by utilizing a saw blade, for example, to cut off the metal layer 214 located in the interval regions 244, 246, 248, and 250 to electrically isolate the bond regions 222, 224, 226, 228, 230, 232, 234, and 236. Therein, the half cutting process does not cut the conductive wires 220.

Figure 16:
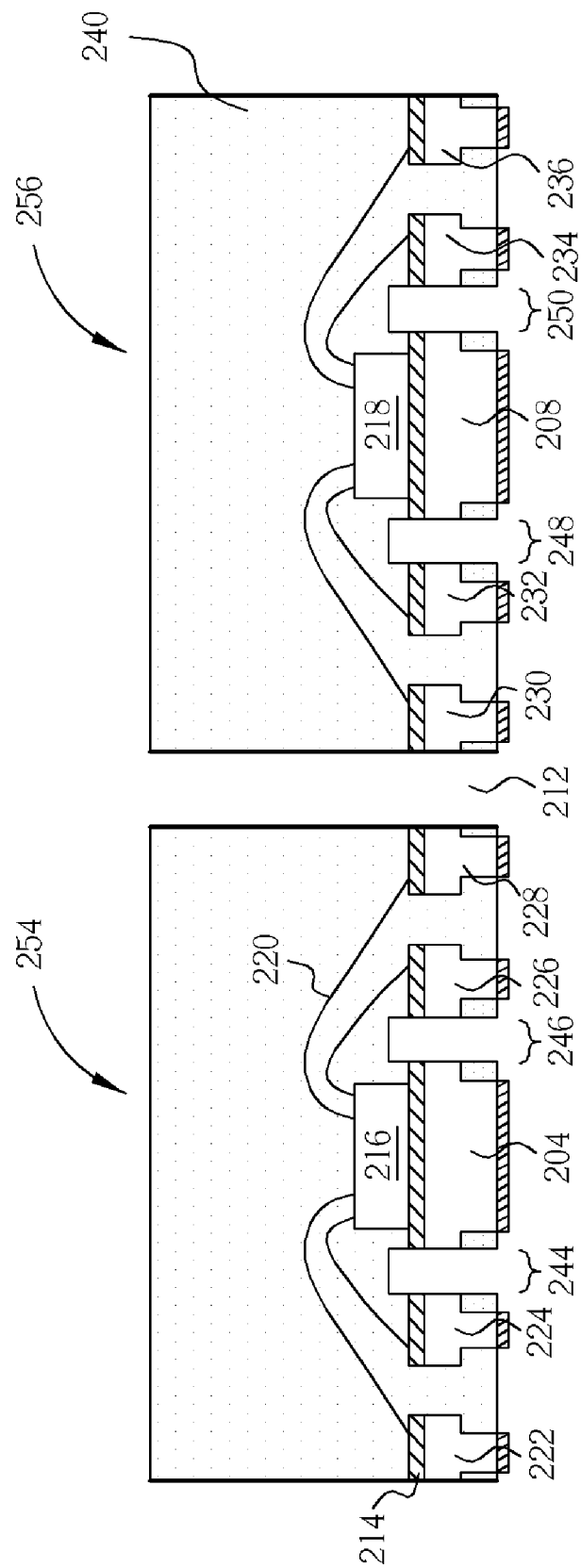

As shown in FIG. 16, a singulation process is performed to singulate the units 100 and 102 by utilizing a saw blade, for example, to cut off the metal layer 214 and the encapsulation 240 located in the outer dambar 212 to form a plurality of leadless semiconductor packages 254 and 256.

Compared to the prior art, the present invention utilizes an etching process to remove interval regions and outer dambars of a leadframe to expose a metal layer, and then utilizes a half cutting process to cut off the metal layer located in the interval regions and a singulation process to singulate units of the leadframe by cutting off the metal layer and the encapsulation located in the outer dambars. Therefore, the saw blade just needs to cut off the thin film metal layer and the encapsulation. The present invention is therefore capable of reducing the expenditure of saw blades.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming leadless semiconductor packages comprising:

providing a leadframe comprising a first metal layer formed on an upper surface of the leadframe and a plurality of units in an array arrangement, wherein each of the units comprises a die pad, a plurality of leads comprising a plurality of bond regions, and a plurality of outer dambars disposed in a periphery of each of the units;

adhering a lower surface of a die to the first metal layer of the die pad, wherein a plurality of bond pads are disposed on an upper surface of the die;

forming a plurality of conductive wires to electrically connect the bond pads with the corresponding bond regions of the leads;

forming an encapsulation covering the die, the leads, and the leadframe, wherein the encapsulation exposes lower surfaces of the die pad, the leads, and the outer dambars;

forming a patterned photoresist layer on a lower surface of the leadframe, wherein the patterned photoresist layer exposes a plurality of interval regions of the leads and the outer dambars;

performing an etching process by utilizing the patterned photoresist layer as a mask to expose the first metal layer located in the interval regions and the outer dambars;

removing the patterned photoresist layer;

forming a second metal layer on the lower surfaces of the die pad, the leads, and the outer dambars after removing the patterned photoresist layer;

cutting off the first metal layer located in the interval regions by utilizing a half cutting process to electrically isolate the bond regions; and performing a singulation process to singulate the units by cutting off the first metal layer and the encapsulation located in the outer dambars.

2. The method for forming leadless semiconductor packages of claim 1, wherein the interval regions are located between the adjacent bond regions.

3. The method for forming leadless semiconductor packages of claim 1, wherein the leads connect to the die pad.

4. The method for forming leadless semiconductor packages of claim 3, wherein the interval regions are located between the bond regions and the adjacent die pad.

5. The method for forming leadless semiconductor packages of claim 1, wherein the units connect together with the outer dambars.

6. The method for forming leadless semiconductor packages of claim 1, wherein the leadframe is composed of copper, iron, or an alloy of copper and iron.

7. The method for forming leadless semiconductor packages of claim 1, wherein the leads connect to the outer dambars.

8. The method for forming leadless semiconductor packages of claim 1, wherein each of the units further comprises a plurality of tie bars connecting the die pad and the outer dambars.

9. The method for forming leadless semiconductor packages of claim 8, wherein each of the units further comprises a plurality of inner dambars connecting the leads serially and the tie bars.

10. The method for forming leadless semiconductor packages of claim 9, wherein the patterned photoresist layer exposes the inner dambars, and the etching process removes the inner dambars simultaneously to expose the first metal layer located in the inner dambars.

11. The method for forming leadless semiconductor packages of claim 10, wherein the half cutting process cuts off the first metal layer located in the inner dambars to electrically isolate the bond regions.

12. The method for forming leadless semiconductor packages of claim 1, wherein the first metal layer is composed of silver.

13. The method for forming leadless semiconductor packages of claim 1 further comprising a step of adhering a tape on the lower surface of the leadframe before forming the encapsulation covering the leadframe, and a step of removing the tape after forming the encapsulation covering the leadframe.

14. The method for forming leadless semiconductor packages of claim 1, wherein the second metal layer is composed of tin or lead.

15. The method for forming leadless semiconductor packages of claim 1, wherein the half cutting process utilizes a saw blade to perform cutting.

16. The method for forming leadless semiconductor packages of claim 1, wherein the leads are in-line leads.

17. The method for forming leadless semiconductor packages of claim 1, wherein the leads are staggered leads.

\* \* \* \* \*